United States Patent [19]
Aubert et al.

[11] Patent Number: 4,486,285
[45] Date of Patent: Dec. 4, 1984

[54] CHROMIUM COATING WITH HIGH HARDNESS CAPABLE OF RESISTING WEAR, STRAIN SURFACE FATIGUE AND CORROSION ALL AT THE SAME TIME

[75] Inventors: André Aubert, Grenoble; Jacques Chevallier, Meylan; Antoine Gaucher, Andrezieux-Boutheon; Jean-Paul Terrat, Saint Etienne, all of France

[73] Assignee: Centre Stephanois De Recherches Mecanmiques Hydromecanique et Frottement, France

[21] Appl. No.: 414,100

[22] Filed: Sep. 2, 1982

[30] Foreign Application Priority Data

Sep. 3, 1981 [FR] France ................. 81 17040

[51] Int. Cl.$^3$ ............................. C23C 15/00
[52] U.S. Cl. ........................ 204/192 C; 204/192 R; 204/192 SP; 428/689; 428/698
[58] Field of Search ............. 204/192 C, 192 R; 428/689, 698

[56] References Cited

U.S. PATENT DOCUMENTS

| | | | |
|---|---|---|---|
| 3,632,494 | 11/1967 | Herte et al. | 204/192 C |
| 3,635,811 | 1/1972 | Lane | 204/192 C |
| 3,912,461 | 10/1975 | Wakefield | 204/192 C |

OTHER PUBLICATIONS

Diegle et al., J. Electro. Chem. Soc., Sep. 1980, pp. 2030-2033.
Harding, J. Vac. Sci. Technol., 13, (1976), pp. 1070-1073.
Brainard et al., J. Vac. Sci. Technol., 15, (1978), pp. 1800-1805.

Primary Examiner—Arthur P. Demers
Attorney, Agent, or Firm—Remy J. VanOphem

[57] ABSTRACT

By cathode sputtering in a reactive environment, a coating of a solid solution of chromium and an element such as nitrogen, carbon, phosphorus, boron or silicon is deposited. The content of the above element is higher than the saturation limit of the solid solution in chromium. It ranges between $T_m=0.2\%$ and $T_M=3\%$ by weight for carbon and between $T_m=0.04\%$ and $T_M=3.5\%$ by weight for nitrogen.

12 Claims, 1 Drawing Figure

CHROMIUM COATING WITH HIGH HARDNESS CAPABLE OF RESISTING WEAR, STRAIN SURFACE FATIGUE AND CORROSION ALL AT THE SAME TIME

BACKGROUND OF THE INVENTION

The present invention relates to the depositing of a coating layer based on chromium on a support piece to provide a chromium coating with high hardness and resistance to wear, strain, fatigue and corrosion.

The board use made today of hard chromium electroplated coatings for improving the wear and corrosion resistance of mechanical parts, especially frictional parts, is known.

The many disadvantages and limitations of this type of plating or coating are also known. For example, the hardness from one thousand to eleven hundred Vickers (1000–1100 VH) on the average of the coating, while certainly higher than that of the majority of current mechanical construction materials, is nonetheless insufficient to resist severe abrasion wear effects. The coating has a tendency to form cracks, which for applications in a corrosive environment, makes it necessary to have recourse to either large deposit thicknesses (which is a definite handicap, given the slow deposition rate) or else protective sub-coatings, for example nickel, which accordingly increase the cost of the parts treated. There is a harmful effect on the fatigue resistance of plated or coated substrates by reason of the occlusion of hydrogen in the coating and of the formation of hydrates and oxides. The coating is too highly fragile, causing breaking of the coating in a case of strain of the substrate under the combined normal and tangential stresses. Finally, another problem is created by pollution by chromium (VI) contained in the effluents, requiring expensive neutralization installations.

Certainly processes are known which permit alleviating one or another of these disadvantages. For example, the technique of physical deposition in the vapor phase prevents pollution and leads to much less cracked deposits than those which can be achieved by the electroplating method; but the chromium thus obtained is generally low in hardness, from five hundred to six hundred Vickers (500 to 600 VH). Also, for example, coatings of chromium carbides or nitrides present a high hardness and good corrosion resistance, especially when they are achieved by the technique of physical deposition in the vapor phase, but their fragility makes them unsuited for resisting even a small strain on the substrate, etc.

SUMMARY OF THE INVENTION

The present invention proposes a coating based on chromium which can be carried out on any substrate and at the same time possesses all the advantages of the layers previously recalled, while being free from their disadvantages. The present invention provides a coating having the following combined advantages:
 a very high hardness, up to or exceeding 3000 VH;
 the absence of cracks, thus, an excellent protection of the substrate against corrosion;
 no brittleness of the substrate caused by hydrogen and, no appreciable reduction in fatigue resistance in the mass of the parts treated, the fatigue resistance being improved by the absence of cracks in the coating;
 a good capacity for withstanding even large strains in the substrate without breaking;
 a good fatigue resistance of the surface, that is, resistance to repeated frictional actions;
 a good thermal and electrical conductivity; and
 no polution, either solid, liquid or gaseous, during its use.

DETAILED DESCRIPTION OF THE PREFERRED EMBODIMENT

According to a first possible embodiment, the procedure is by reactive cathode sputtering. In this case, the sputtering of a chromium target is done in a reactive environment containing at least one preselected element E which is capable of forming a solid solution of insertion with chromium, the element E becoming introduced into the chromium with a deformation of the crystal lattice but without creating a second phase such as $Cr_{23}C_6$ for example. A coating is obtained on substrates placed in relation to the target. It can be expected that the composition of the coating corresponds to that which could be predicted from the corresponding chromium/element E equilibrium diagram. The element E may for example be nitrogen, carbon, phosphorus, boron or silicon.

This is what actually happens below a content $T_m$ of element E in the plating or coating.

This is also what happens above a content $T_M$ of the element E in the coating.

Figure 1:
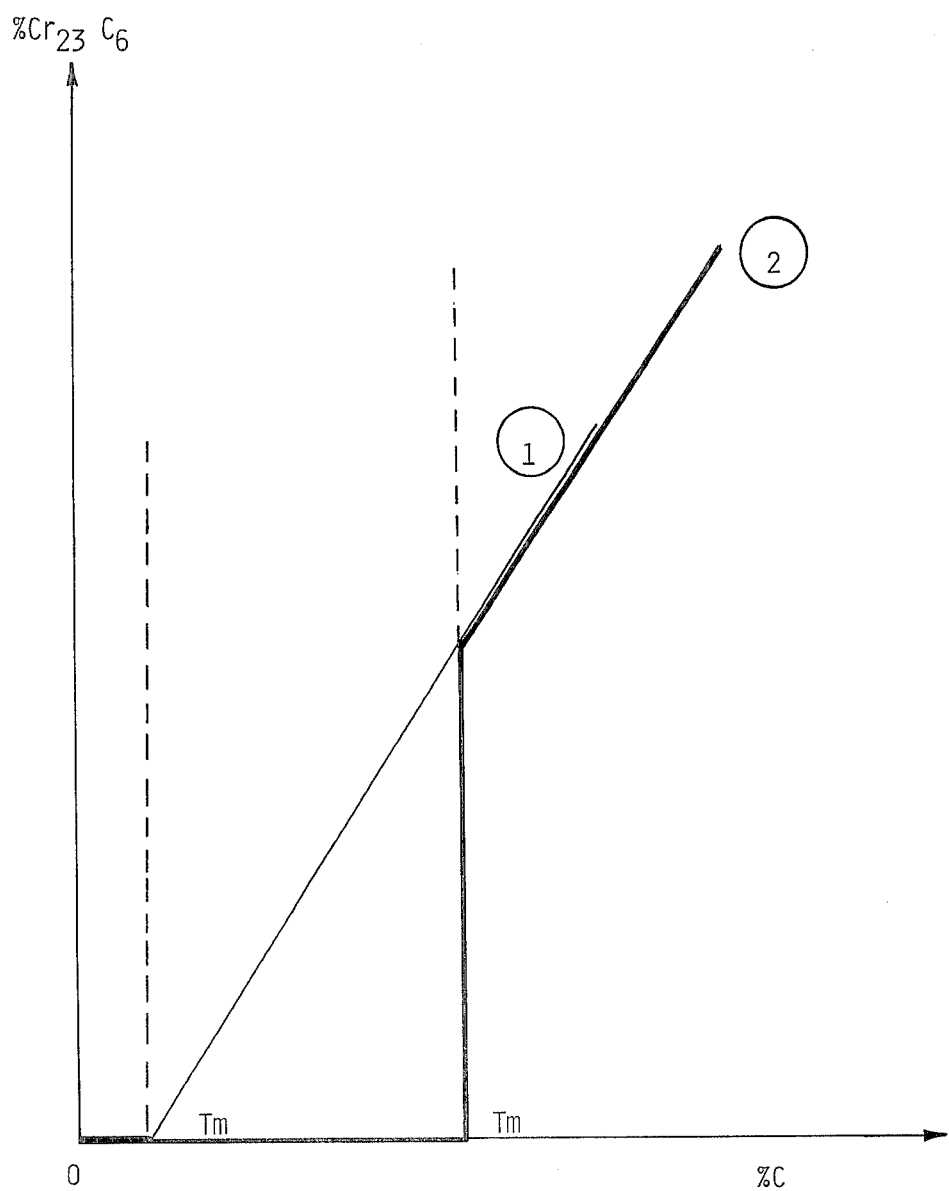
FIG. 1 of the drawing illustrates graphically the theoretical and the actual results of reactive cathode sputtering of chromium in the presence of carbon.
Figure 1:
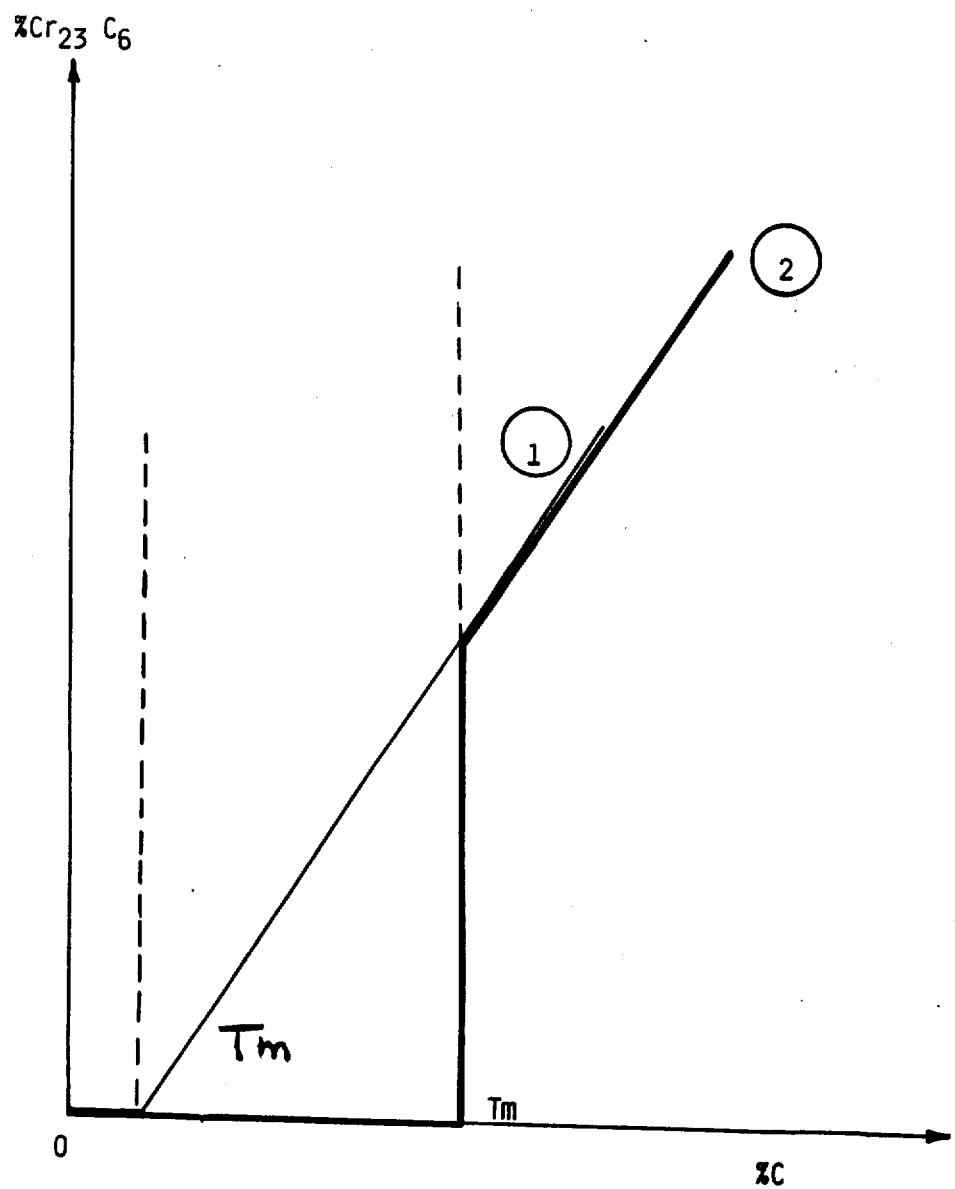

By contrast and, surprisingly, for a content of element E in the coating falling between $T_m$ and $T_M$, none of the compounds or phases such as could be predicted from the corresponding chromium/element E equilibrium diagram are found in the coating. This result is depicted in FIG. 1 of the drawing attached hereto wherein the theoretical graph 1 is compared with the actual graph 2.

Thus, as a nonrestrictive example, when the sputtering of a chromium target is accomplished in a reactive environment based on carbon or a carbonaceous product, no chromium/carbon compound or phase appears up to a carbon content T of less than three percent (3%) in the coating. Now the equilibrium diagram of the binary system chromium/carbon predicts that chromium/carbon compounds or phases may appear as soon as the carbon content of the coating is above a minimum $T_m$ value about two tenths of one percent (0.2%).

On the contrary, when the carbon content of the layer exceeds a maximimum $T_M$ value of the three percent (3%), the phases and/or compounds predictable from the equilibrium diagram are found in the latter.

Generally, such results are obtained at all times when the environment of the treatment contains a substance capable of forming solid solutions of insertions with chromium, a subtance such as carbon and/or nitrogen, likewise such as phosphorus, boron, silicon, etc.

$T_M$ corresponds to the solid solution to the degree that the carbon content T increases, we leave the solid solution and enter into the realm of phases.

Now, quite surprisingly, the properties of chromium coatings formed when their insertion element content ranges between $T_m$ and $T_M$ are entirely different from on the one hand those obtained by sputtering a chromium target in an environment free of products capable of forming solid solutions of insertions with chromium, and on the other hand from those obtained when the chromium target is sputtered in an environment where the content of these same elements is such that it leads to the formation of a coating in which the insertion element content is higher than $T_M$.

In the absence of products capable of forming solid solutions of insertion with chromium, coatings with low hardness, that is less than 600 VH are obtained. Above an insertion element content of $T_M$, the coatings formed show an increasing brittleness and a substantial decrease in fatigue resistance.

In contrast, for insertion element contents ranging between $T_m$ and $T_M$, the coatings formed have all of the properties stated above in the summary at the same time. In other words, reactions between the two contents $T_m$ and $T_M$ is outside of the thermodynamic equilibrium range. The invention consists of producing a plating or coating in this crystallographic state constituents of which are outside the thermodynamic equilibrium range. For obtaining this result it is particularly favorable for the partial pressure of reactive elements in the treatment environment to range between one hundred thousandths ($10^{-5}$) and one hundredth ($10^{-2}$) torr.

If the element E is carbon or a substance capable of liberating carbon, for example methane or acetylene, the cathode sputtering is done under a partial vacuum in an environment of argon with which methane or acetylene is admixed.

According to one possible practice, and in a nonlimiting way, pieces which have not been heated initially are exposed to cathode sputtering. They undergo heating only by the radiation due to the presence of a plasma. In the known apparatus it is found that this heating by radiation brings the piece to an elevated temperature which becomes naturally stabilized at a temperature of the order of 200° C.

Once the chromium coating has been applied, the sputtering is stopped and the piece is allowed to cool off naturally either by leaving it under a partial vacuum or, alternatively, in ambient air if the machine has been opened.

Below is given, as a nonlimiting example, a description of the remarkable properties of a coating made according to the method of the present invention, the coating being based on carbon. Results of the same type are obtained with nitrogen, or even a mixture of carbon and nitrogen, and, more generally in all the cases where the treatment environment contains a substance capable of forming solid solutions of insertion with chromium.

EXAMPLE

By the technique of cathode sputtering, a chromium target was sputtered on steel substrate. The sputtering was done under a reduced pressure of about one thousandth ($10^{-3}$) torr of argon. In this way coatings fifteen thousandths of a millimeter (0.015 mm) in thickness on the substrates were achieved in about thirty (30) minutes deposition time.

By operating under the same operating conditions each time, that is, at the same power of discharge, distance of pieces from cathode, and polarization voltage, etc., coatings free of carbon (Case 1), coatings containing eighteen percent (0.18%) by weight of carbon (Case 2), coatings according to the present invention containing one and twenty two hundredths of a percent (1.22%) by weight of carbon (Case 3) and coatings containing ten percent (10%) by weight of carbon (Case 4) were compared. Comparisons were also made with a classic hard electroplated chromium coating (Case 5).

It will be noted that in Cases 1 and 2 the carbon content of the coating is less than $T_m$; in Case 3, according to the invention, it falls between $T_m$ and $T_M$; and in Case 4 it is higher than $T_M$.

These carbon contents differing from one coating to the other were obtained by causing the partial pressure of carbon to vary in the treatment environment.

The following results were obtained:

(a) Mean microhardness of the coating (in Vickers Number):

| Case 1 | Case 2 | Case 3 | Case 4 | Case 5 |
| --- | --- | --- | --- | --- |
| 600 | 1310 | 2200 | 2600 | 1000-1100 |

It will be noted that the coating according to the present invention (Case 3) has a distinctly higher hardness than that of a coating free of carbon (Case 1) and distinctly higher too than that of a coating of classical hard electroplated chromium (Case 5). By contrast, when the carbon content is higher than $T_M$ (Case 4) the hardness increases still further but is then accompanied by a brittleness due to the presence of carbide $Cr_{23}C_6$.

(b) Resistance to fatigue in the mass:

The test pieces tested were of the rotary deflection type of tempered steel type 35 C D 4 tempered at five hundred and seventy degrees celcius (570°) and rotating at ten thousand (10,000) revolutions per minute.

| | Case 3 | Case 5 |
| --- | --- | --- |
| Endurance limit | 57.34 hbars | 51.35 hbars |

A substantial improvement in fatigue resistance will be noted in the coating according to the present invention (Case 3) as compared with a coating of classic hard electroplated chromium (Case 5).

(c) Strain resistance:

Strain resistance is illustrated by the following test. Two sheets of steel one millimeter (1 mm) thick and coated on one of its faces are used, one with a chromium coating fifteen (15) microns thick according to the present invention obtained by cathode sputtering and containing one and twenty two hundredths of a percent (1.22%) by weight of carbon (Case 3) and the other with a coating of hard electroplated chromium of the same thickness. Each was subjected to a bending strain, test conditions being the same in both cases, with the same bending angle and the same strain rate.

No damage to the chromium coating according to the present invention was observed after the bending test on the sheet. This coating has followed the deformation of the substrate. The hard electroplated chromium coating showed a great many signs of flaking off after bending. The electroplated coating was not able to follow the deformation of the substrate and broke, which caused the appearance of peeling off. The same result, flaking and peeling off, is obtained with a coating of the type of Case 4, where the carbon content is greater than $T_M$.

(d) Fatigue resistance of the surfaces:

The principle of the test made, which makes it possible to quantify phenomena such as pitting, consists of rigorously applying the same strain bar to the same micro-volume of the test piece millions of times. In this test, a stud of tungsten carbide cyclically strikes against the same zone of a cylindrical test piece of 35 C D 4 steel tempered at five hundred and seventy degrees celcius (570°). When the cylindrical test piece is coated with a layer of hard electroplated chromium fifteen (15) microns thick (Case 5), the first appearances of "pitting" come after five million ($5 \times 10^6$) actions, the strain applied being one hundred and twenty hectobars ($1.2 \times 10^{10}$ dyne/cm²).

When the test piece is coated with a coating of chromium according to the present invention and containing one and twenty two hundredths of a percent (1.22%) of carbon (Case 3), there is no appearance of pitting after sixty million ($6 \times 10^7$) actions under the same applied strain. With a test piece coated with a coating of the type that of Case 4, the first damage appears after nine million ($9 \times 10^6$) actions.

(e) Corrosion resistance:

In a corrosion test in a salt spray, the first pittings appear after some tens of hours of exposure on a test piece coated with fifteen (15) microns of classic hard electroplated chromium. When the test piece is treated according to the present invention, it is always intact after one hundred and fifty (150) hours of exposure.

In the above example, it should be noted that only the coating according to the present invention (Case 3) satisfies at once all the demands of hardness, strain resistance, fatigue resistance of the surfaces and corrosion resistance. The coatings of Cases 1, 2 and 5 are less hard. Those of Cases 4 and 5 are less resistant to fatigue of the surfaces, etc.

According to a second possible embodiment according to the present invention, the procedure is by nonreactive cathode sputtering. In this case the element E is introduced not at the level of the gaseous environment but instead enters directly into the composition of the cathode target or workpiece.

Thus, as an example, if the element E which is to form a solid solution of insertion with chromium is composed of carbon, this may be introduced in a reactive mode in the form of a hydrocarbon such as methane in the gaseous environment. In the nonreactive mode it is introduced into the target in element form. The target is formed by a mixture of chromium and carbon.

Accordingly to another example, if the element E which is to form a solid solution of insertion with chromium is carbon, the latter may be introduced in a reactive mode into the gaseous environment in the form of a hydrocarbon such as methane. In the nonreactive mode this is introduced directly into the target either in the elemental form or in the form of a carbide. In the former case, the target is formed by a mixture of chromium and carbon, in the form of graphite for example. In the later case, the target is formed by a mixture of chromium and chromium carbide ($Cr_3C_2$ for example).

In the case of nitrogen, this element is supplied by a nitride. The target then consists of a mixture of chromium and chromium nitride, for example, $Cr_2N$.

According to this embodiment using nonreactive cathode sputtering, the coating obtained is certainly one of the solid solution of insertion type. The element E present in the coating is in the same proportions as the element E present in the target.

The example below illustrates the properties of a chromium coating with carbon as the element of insertion.

In this example of practicing the present invention, a nonreactive method of cathode sputtering is used. The target is formed by a mixture of ninety eight and eight tenths of one percent (98.80%) of chromium and one and two tenths of one percent (1.20%) of graphite by weight.

The coating obtained by the cathode sputtering of this target contains one and eighteen hundredths of one percent (1.18%) of carbon. Its microhardness is twenty two hundred Vickers (2,200 VH). Its properties of mass fatigue, surface fatigue and corrosion are similar to those described previously.

In another example, a chromium layer is produced with high hardness in a nonreactive atmosphere. A target consisting of a mixture of chromium and chromium carbide was sputtered by cathode sputtering. The target contains three and nine tenths percent (3.9%) by weight of $Cr_3C_2$ corresponding one half of one percent (0.5%) carbon in the target. After a sputtering of fifteen (15) minutes under reduced pressure of about one thousandth ($10^{-3}$) torr of argon, a ten thousandth of a millimeter (0.010 mm) coating of chromium with high hardness containing forty five hundredths of one percent (0.45%) of carbon is obtained. The microhardness in Vicker Number of the sample is of the order of fifteen hundred (1,500). The other properties are of the same order of magnitude as those shown in Case 3 of Example 1.

In still another example, a chromium coating of high hardness is produced by cathode sputtering in the presence of nitrogen. By reactive cathode sputtering under a reduced pressure of about twenty two ten thousandths ($2.2 \times 10^{-3}$) torr of argon containing ten percent (10%) nitrogen and after twenty five (25) minutes sputtering a layer fifteen thousandths of a millimeter (0.015 mm) thick with high hardness and containing one percent (1%) nitrogen was obtained. The microhardness in Vickers Number is twelve hundred (1,200), the other properties being of the same order of magnitude as those shown in Case 3 of the above example.

What is claimed as novel is as follows:

1. A method of chromium plating a workpiece in the presence of a preselected element capable of forming a solid solution with chromium, said preselected element being selected from a group consisting of carbon and nitrogen, said method comprising the steps of:
   placing said workpiece in a vacuum;
   cathode sputtering said chromium onto a surface of said workpiece; and
   introducing said preselected element during said cathode sputtering in a predetermined proportion to said chromium, said predetermined proportion being between a lower limit $T_m$ and a higher limit $T_M$ such that between these two limits none of the compounds and phases thermodynamically predictable from the equilibrium diagram of chromium with said preselected element are found in the coating, the lower limit $T_m$ being the saturation limit of the equilibrium diagram of said preselected element in chromium, said predetermined proportion thereby being outside of the thermodynamic equilibrium range of solution of said preselected element in chromium.

2. The method of chromium plating of claim 1 wherein said preselected element is introduced in a reactive environment capable of forming at least one solid solution of insertion with chromium.

3. The method of chromium plating of claim 2 wherein said reactive environment comprises hydrocarbon gas.

4. The method of chromium plating of claim 3 wherein said hydrocarbon gas is methane.

5. The method of chromium plating of claim 1 wherein said preselected element is introduced in a non-reactive environment, said preselected element being introduced directly into said workpiece.

6. The method of chromium plating of claim 5 wherein said preselected element is introduced into said workpiece in elemental form.

7. The method of chromium plating of claim 5 wherein said preselected element is introduced into said workpiece in the form of a compound containing said preselected element.

8. The method of chromium plating of claim 7 wherein said compound is hydrocarbon.

9. The method of chromium plating of claim 1 wherein said preselected element is carbon and further wherein said lower limit $T_m$ is 0.2% by weight and the higher limit $T_M$ is 0.3% by weight.

10. The method of chromium plating of claim 1 wherein said preselected element is nitrogen and further wherein said lower limit $T_m$ is 0.04% by weight and the higher limit $T_M$ is 3.5% by weight.

11. The plated workpiece formed by the method of claim 1.

12. The plated workpiece formed by the method of claim 5.

* * * * *

UNITED STATES PATENT AND TRADEMARK OFFICE
CERTIFICATE OF CORRECTION

PATENT NO. : 4,486,285
DATED : December 4, 1984
INVENTOR(S) : Aubert, et al

It is certified that error appears in the above-identified patent and that said Letters Patent is hereby corrected as shown below:

Figure 1 should appear as shown on the attached sheet.

Signed and Sealed this

Twelfth Day of November 1985

[SEAL]

Attest:

Attesting Officer

DONALD J. QUIGG

Commissioner of Patents and Trademarks